United States Patent
Huang

(10) Patent No.: US 7,916,819 B2
(45) Date of Patent: Mar. 29, 2011

(54) RECEIVER SYSTEM AND METHOD FOR AUTOMATIC SKEW-TUNING

(75) Inventor: Chih-Haur Huang, Fonghua Village (TW)

(73) Assignee: Himax Technologies Limited, Tainan County (TW)

( * ) Notice: Subject to any disclaimer, the term of this patent is extended or adjusted under 35 U.S.C. 154(b) by 719 days.

(21) Appl. No.: 11/907,175

(22) Filed: Oct. 10, 2007

(65) Prior Publication Data

US 2009/0096498 A1    Apr. 16, 2009

(51) Int. Cl.
H03L 7/06 (2006.01)

(52) U.S. Cl. .................... 375/355; 375/373; 327/144

(58) Field of Classification Search .......... 375/371, 375/376, 354, 355; 327/147, 144, 146, 155, 327/156; 712/E9.063
See application file for complete search history.

(56) References Cited

U.S. PATENT DOCUMENTS

| | | | |
|---|---|---|---|
| 4,077,010 A * | 2/1978 | Ryon | 327/116 |
| 7,194,057 B2 | 3/2007 | Lin | |
| 7,778,375 B2 | 8/2010 | Lu | |
| 2002/0075980 A1 | 6/2002 | Tang et al. | |
| 2002/0085656 A1 * | 7/2002 | Lee et al. | 375/355 |
| 2004/0202266 A1 * | 10/2004 | Gregorius et al. | 375/355 |
| 2005/0002475 A1 * | 1/2005 | Menolfi et al. | 375/340 |
| 2005/0084048 A1 | 4/2005 | Wu | |
| 2005/0245200 A1 * | 11/2005 | Kluge et al. | 455/76 |
| 2006/0078079 A1 * | 4/2006 | Lu | 375/376 |
| 2007/0047689 A1 * | 3/2007 | Menolfi et al. | 375/376 |

FOREIGN PATENT DOCUMENTS

| | | |
|---|---|---|
| TW | 226774 B | 1/2005 |
| TW | 241776 B | 10/2005 |
| TW | 265703 B | 11/2006 |

OTHER PUBLICATIONS

M. Rau, et al., "Clock/Data Recovery PLL Using Half-Frequency Clock", IEEE JSSC, vol. 32, No. 7, pp. 1156-1159, Jul. 1997, Drawing 2.
H. -H. Chang, et al., "Low Jitter and Multirate Clock and Data Recovery Circuit Using a MSADLL for Chip-to-Chip Interconnection," IEEE Trans. Circuits and systems, vol. 51, No. 12, pp. 2356-2364, Dec. 2004, Drawing 2.
D. Dalton et al.,"A 12.5- Mb/s to 2.7-Gb/s Continuous-Rate CDR With Automatic Frequency Acquisition and Data-Rate Readback," IEEE JSSC, vol. 40, No. 12, pp. 2713-2725, Dec. 2005. Drawing 6.

* cited by examiner

*Primary Examiner* — Chieh M Fan
*Assistant Examiner* — Aristocratis Fotakis
(74) *Attorney, Agent, or Firm* — Rabin & Berdo, P.C.

(57) ABSTRACT

A receiver system is provided. The receiver system includes a control unit for outputting a control signal and a selective signal, a PLL unit for generates PLL clock signals based on an initial clock signal, a phase select unit for selecting one of the PLL clock signals as a base clock signal according to the selective signal, a DLL unit for generating DLL clock signals based on the base clock signal, a sampling clock unit for generating left and right clock signals based on the DLL clock signals and a data latch unit for sampling bit data according to the left, DLL, and right clock signals to obtain left, middle and right data, which are feedback to the control unit for outputting the control signal and the selective signal to adjust the left, DLL and right clock signals or select the base clock signal for next bit data.

20 Claims, 9 Drawing Sheets

RECEIVER SYSTEM AND METHOD FOR AUTOMATIC SKEW-TUNING

BACKGROUND OF THE INVENTION

1. Field of the Invention

The invention relates in general to a receiver system, and more particularly to a receiver system for automatic skew-tuning.

2. Description of the Related Art

FIG. 1A shows a block diagram of a conventional receiver system 100. The receiver system 100 is for sampling N bit data Di according to an input clock signals Ci during the period Tc, so as to output N output data Dt. Each of the N output data Dt is sampled from one of the N bit data Di. The N bit data Di includes bit data Di(1) to Di(N). The delay-locked loop (DLL) unit 110 generates N clock signals Ck based on the input clock signal Ci. The N clock signals Ck include clock signals Ck(1) to Ck(N). The period of each of the N clock signals Ck is equal to the period of the input clock signal Ci. The clock signal Ck(i+1) lags behind its previous clock signal Ck(i) by 1/N of the period of the input clock signal Ci. The number i is a positive integer smaller than N. The data latch unit 120 samples the serial bit data Di(1) to Di(N) respectively with the clock signals Ck(1) to Ck(N), so as to output the N output data Dt, which includes output data Dt(1) to Dt(N), in parallel.

FIG. 1B is an example of a timing diagram of the N bit data Di and the clock signals Ck(1) to Ck(N) in the period Tc. Referring to FIG. 1B, in this example, the N bit data Di are sampled on the rising edge of the N clock signals Ck. In this example, each bit data is transmitted during one bit time, which is equal to 1/N of the period Tc of the initial clock signal Ci. The skew between the bit data Di(i) and the clock signal Ck(i) is define as the time interval between the middle point of the bit time of the bit data Di(i) and the rising edge of the clock signal Ck(i).

Take the bit data Di(1) as example. In FIG. 1B, the bit data Di(1) is transmitted during the bit time Tb(1). The skew between the bit data Di(1) and the clock signal Ck(1) is the time interval between the middle point of the bit time Tb(1) and the rising edge of the clock signal Ck(1). In the example shown in FIG. 1B, the skew between the bit data Di(1) and the clock signal Ck(1) is small, therefore the bit data Di(1) is correctly sampled on the positive edge of the clock signal Ck(1) during the middle region M(1) of the bit data Di(1).

However, the skews between each of the N bit data Di and its corresponding clock signals Ck may be too large which causes that the N bit data Di can not be sampled correctly. FIG. 1 C is another example of a timing diagram of the N bit data Di and the clock signals Ck(1) and Ck(N). Referring to FIG. 1 C, take the sampling procedure of the bit data Di(1) as an example. The skew SK between the bit data Di(1) and the clock signal Ck(1) is about half of the bit time Tb(1), and the bit data Di(1) is sampled during the data transition area T1. As a result, an incorrect output data Dt(1) is obtained. Therefore, if the skew between each bit data and its corresponding clock signal is too large or if the bit time of each bit data Di is too short, the data latch unit 140 may sample the bit data during the transition area between each bit data Di. Then, the incorrect output data Dt is obtained. Consequently, how to design a receiver system capable of overcoming the skew problem is highly desired.

SUMMARY OF THE INVENTION

The invention is directed to a receiver system. The receiver system can automatically tune the skew between the N bit data and their corresponding clock signals, so that the N bit data can be sampled correctly.

According to a first aspect of the present invention, a receiver system is provided. The receiver system includes a control unit, a phase locked loop (PLL) unit, a phase select unit, a delay locked loop (DLL) unit, a sampling clock unit and a data latch unit. The control unit is for outputting a control signal and a selective signal. The PLL unit is for generating M PLL clock signals based on an initial clock signal. The $i^{th}$ PLL clock signal lags behind the $(i+1)^{th}$ PLL clock signals by 1/M of the period of the initial clock signal, i and M are positive integers. i<M. The phase select unit is for selecting one of the M PLL clock signals as a base clock signal according to the selective signal. The DLL unit is for generating N DLL clock signals based on the base clock signal. The $j^{th}$ DLL clock leads the $(j+1)^{th}$ DLL clock signals by 1/N of the period of the initial clock signal. j is a positive integer. j<N. The sampling clock unit is for generating N left clock signals, N right clock signals based on each DLL clock signal. The $k^{th}$ DLL clock signal lags behind the $k^{th}$ left clock signals and leads the $k^{th}$ right clock signal by a phase difference determined by the control signal. The number k is a positive integer. k<N. The data latch unit is for sampling N bit data in one period of the initial clock according to N left clock signals, N DLL clock signals, and N right clock signals to respectively obtain N left data, N middle data and N right data. The $k^{th}$ left data, the $k^{th}$ middle data and the $k^{th}$ right data are corresponding to the $k^{th}$ left clock signal, the $k^{th}$ DLL clock signal, and the $k^{th}$ right clock signal, and for sampling the $k^{th}$ bit data. The middle, the left and the right data are feedback to the control unit for outputting the control signal and the selective signal to adjust the phase differences between the left clock signal, the DLL clock signal and the right clock signals, or select the base clock signal for next N bit data.

According to a second aspect of the present invention, a receiver system is provided. The receiver system includes a control unit, a PLL unit, a phase select unit, a DLL unit, a sampling clock unit and a data latch unit. The control unit is for outputting a control signal and a selective signal. The PLL unit is for generating M PLL clock signals based on an initial clock signal. The phase select unit is for selecting one of the M PLL clock signals as a base clock signal according to the selective signal. The DLL unit is for generating N DLL clock signals based on the base clock signal. The sampling clock unit is for generating N left clock signals, N right clock signals based on each DLL clock signal. The data latch unit is for sampling N bit data according to N left clock signals, N DLL clock signals, and N right clock signals to obtain N left, middle and right data. The middle, the left and the right data of one of the N bit data are feedback to the control unit for outputting the control signal and the selective signal to adjust the phase differences between the left clock signal, the DLL clock signal and the right clock signal, or select the base clock signal for next N bit data.

According to a third aspect of the present invention, an automatic skew tuning method of a receiver system is provided. The method includes: firstly, select one of M phase locked loop (PLL) clock signals as a base clock signal according to a selective signal. Next, sample each of N bit data by one of N delay locked loop (DLL) clock signals, the left and right clock signal of the one of N DLL clock signals to obtain a middle data, a left data and a right data, wherein the N DLL clock signals corresponds to the base clock signal. Afterward, repeat the data sampling procedure against next N bit data by selecting another one of the M PLL clock signals as the base clock signal or adjusting the phase difference between each of the N DLL clock signals and its corresponding left, right clock signals until the left and right data of each of next N bit data are the same as the middle data of each of next N bit data.

The invention will become apparent from the following detailed description of the preferred but non-limiting embodiments. The following description is made with reference to the accompanying drawings.

DETAILED DESCRIPTION OF THE INVENTION

A receiver system according to an embodiment of the invention includes a control unit, a phase locked loop (PLL) unit, a phase select unit, a delay lock loop (DLL) unit, a sampling clock unit and a data latch unit. The control unit is for outputting a control signal and a selective signal. The PLL unit generating M PLL clock signals based on an initial clock signal. The phase select unit is for selecting one of the M PLL clock signals as a base clock signal according to the selective signal. The DLL unit is for generating N DLL clock signals based on the base clock signal. The sampling clock unit is for generating N left clock signals, N right clock signals based on N DLL clock signals. The data latch unit is for sampling N bit data according to N left clock signals, N DLL clock signals, and N right clock signals to obtain N left, middle and right data. The middle, the left and the right data of one of the N bit data are feedback to the control unit for outputting the control signal and the selective signal to adjust the phase differences between the left clock signal, the DLL clock signal and the right clock signal, or select the base clock signal for next N bit data.

Figure 1A:
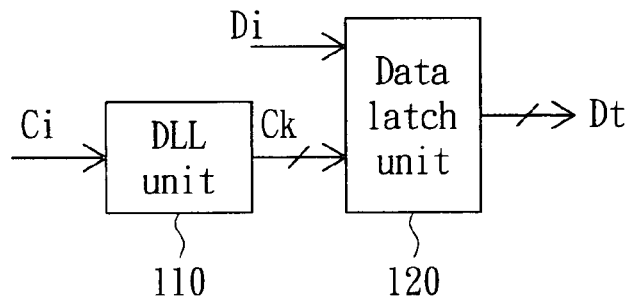
FIG. 1A shows a block diagram of a conventional receiver system 100.
Figure 1B:
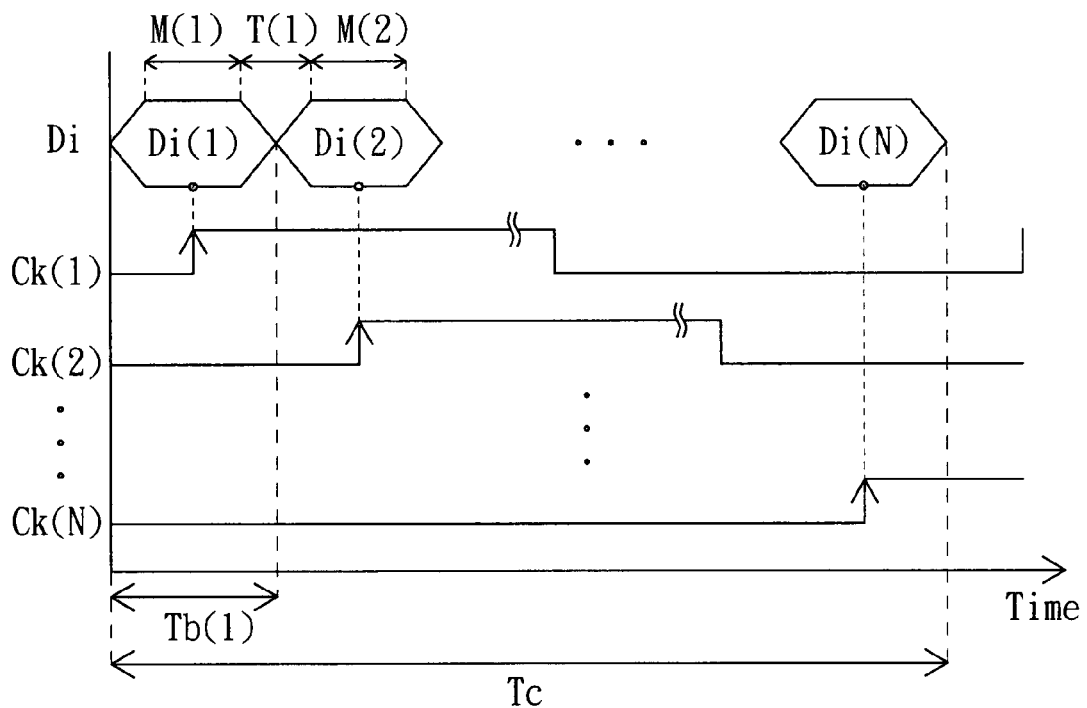
FIG. 1B show an example of a timing diagram of N bit data and N clock signal in FIG. 1A.
Figure 1C:
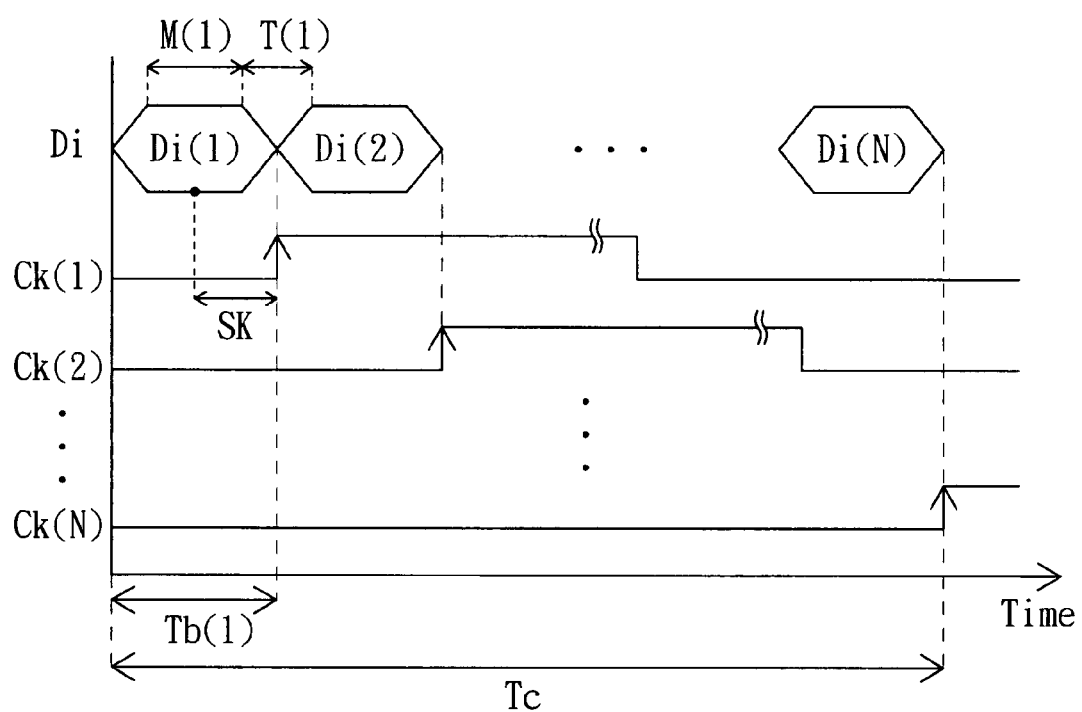
FIG. 1C show another example of a timing diagram of the N bit data and the N clock signal in FIG. 1A.
Figure 2:
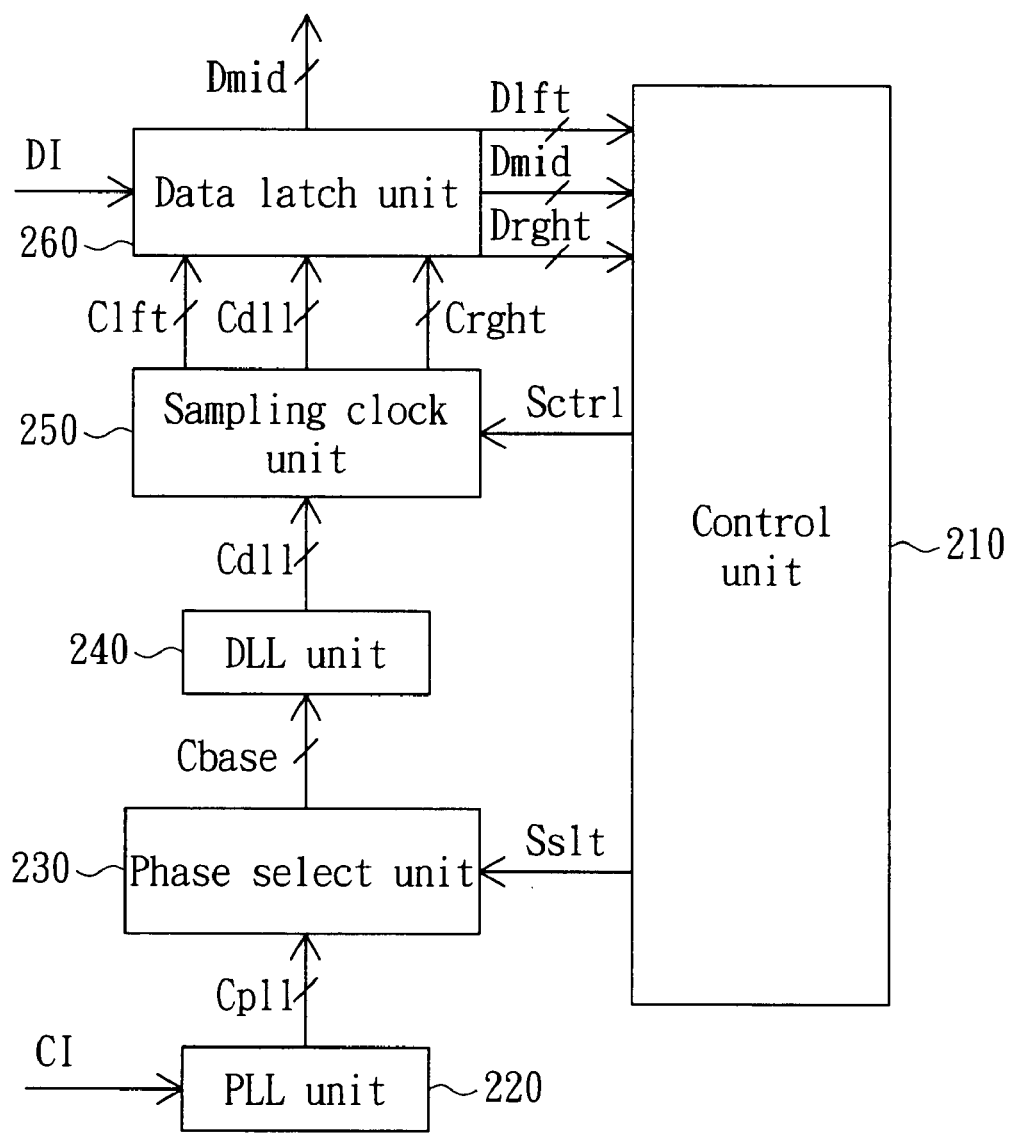
FIG. 2 is a block diagram of the receiver system 200 according to the embodiment of the invention.

FIG. 2 is a block diagram of the receiver system 200 according to the embodiment of the invention. The receiver system 200 is for sampling N bit data Dl according to an initial clock signal Cl in one period Tc of the initial clock signal Cl. The receiver system 200 includes a control unit 210, a PLL unit 220, a phase select unit 230, a DLL unit 240, a sampling clock unit 250 and a data latch unit 260. The N bit data Dl includes bit data Dl(1) to Dl(N) serially inputted to the receiver system 200 during one period of the initial clock. The number N is a positive integer.

The PLL unit 220 receives the initial clock signal Cl and generates M PLL clock signals Cpll accordingly. The M PLL clock signals Cpll includes PLL clock signals Cpll(1) to Cpll(M). The number M is a positive integer.

Figure 3A:
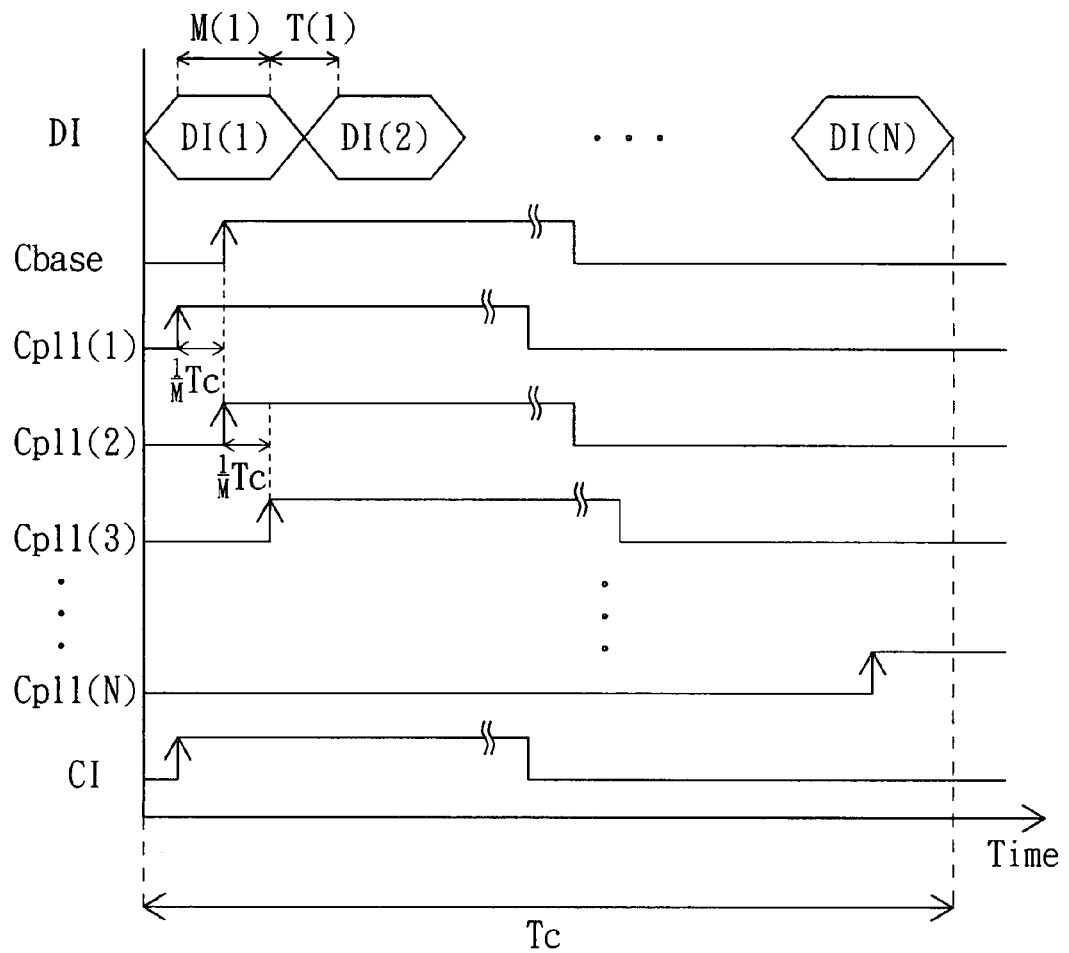
FIG. 3A shows an example of timing diagram of N bit data, the initial clock signal, M PLL clock signals generated according to the initial clock signal, and a base clock signal in one period of the initial clock signal.

FIG. 3A shows an example of timing diagram of the N bit data Dl, the initial clock signal Cl, the M PLL clock signals Cpll generated according to the initial clock signal Cl, a base clock signal Cbase in one period Tc of the initial clock signal Cl. Referring to FIG. 3A, each bit data is transmitted during one bit time, which is equal to 1/N of the period Tc of the initial clock signal Cl. Each bit data needs to be sampled during its middle region in order to get a correct output data. An incorrect output data is obtained if each bit data is sampled during a data transition region. For example, when the bit data Dl(1) is sampled during its middle region M(1), its corresponding output data is obtained correctly. Instead, when the first bit data Dl(1) is sampled during a data transition region, e.g. the data transition region T(1), its corresponding output data is obtained incorrectly.

Refer to FIGS. 2 and 3A at the same time. In this embodiment, the $(k+1)^{th}$ PLL clock signal Cpll(k+1) lags behind the $k^{th}$ PLL clock signal Cpll(k) by a phase difference equal to 1/M of the period Tc of the initial clock signal Cl. For example, in FIG. 3A, the second PLL clock signal Cpll(2) lags behind the first PLL clock signal Cpll(1) by a phase difference equal to 1/M of the period Tc, while the third PLL clock signal Cpll(3) lags behind the second PLL clock signal Cpll(2) by a phase difference equal to 1/M of the period Tc. The number k is a positive integer smaller than M.

Figure 3B:
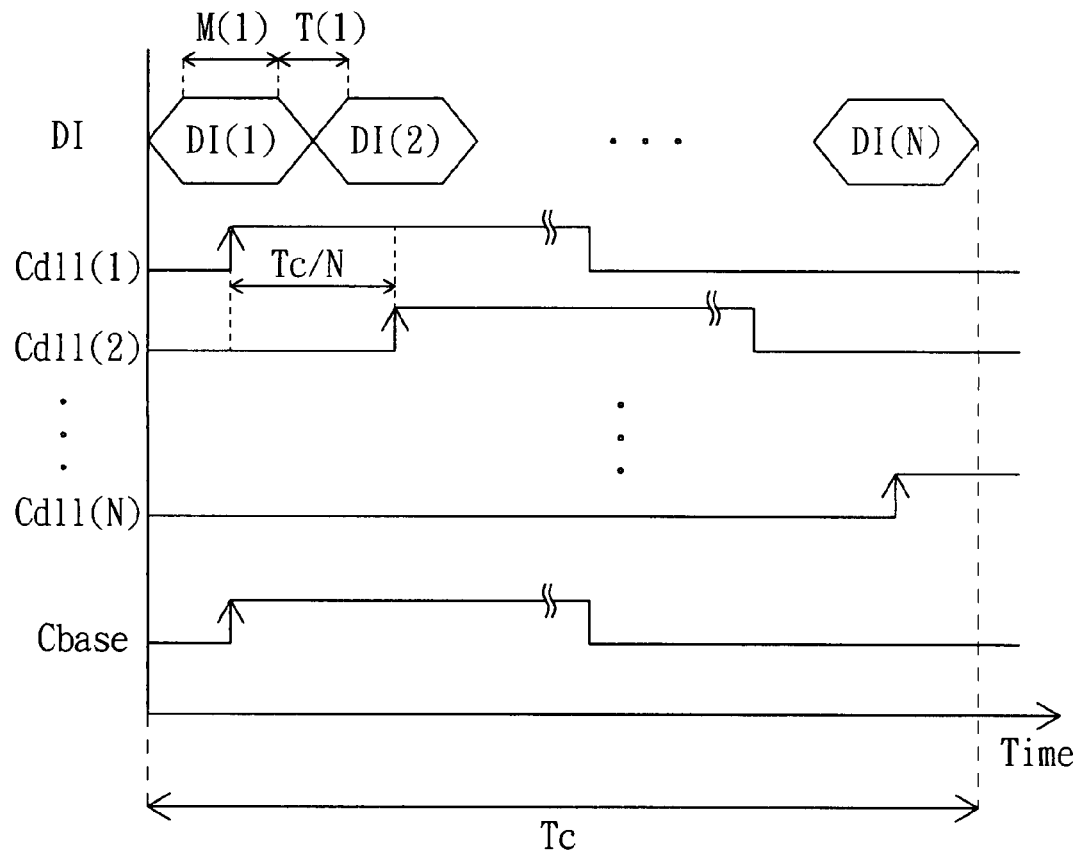
FIG. 3B shows an example of a timing diagram of the N bit data and the base clock signal shown in FIG. 3A, and N DLL clock signals in one period of the initial clock signal.

The control unit 210 outputs a selective signal Sslt to the control phase select unit 230, so as to control the phase select unit 230 to select one of the M PLL clock signal Cpll as a base clock signal Cbase. Referring to FIG. 3A, in this example, the second PLL clock signal Cpll(2) is selected as the base clock signal Cbase. 10028 The DLL unit 240 generates N DLL clock signals Cdll based on the base clock signal Cbase. The N DLL clock signals Cdll includes clock signals Cdll(1) to Cdll(N). FIG. 3B shows an example of a timing diagram of the bit data Dl(1) to Dl(N) and the base clock signal Cbase shown in FIG. 3A, and the DLL clock signals Cdll(1) to Cdll(N) in one period Tc of the initial clock signal Cl. Referring to FIG. 3B, in this embodiment, the $(i+1)^{th}$ DLL clock signal Cdll(i+1) lags behind the $i^{th}$ DLL clock signal Cdll(i) by 1/N of the period Tc of the initial clock signal Cl. In this embodiment, the bit data Dl(1) to Dl(N) are sampled on the positive edge of the clock signal Cdll(1) to Cdll(N), respectively. The number i is a positive integer smaller than N.

The control unit 210 outputs a control signal Sctrl to the sampling clock unit 250, so as to control the sampling clock unit 250 to generate N left clock signals Clft and N right clock signals Crght based on the N DLL clock signals Cdll. The N left clock signals Clft includes left clock signals Clft(1) to Clft(N), while the N right clock signals Crght includes right clock signals Crght(1) to Crght(N).

Figure 3C:
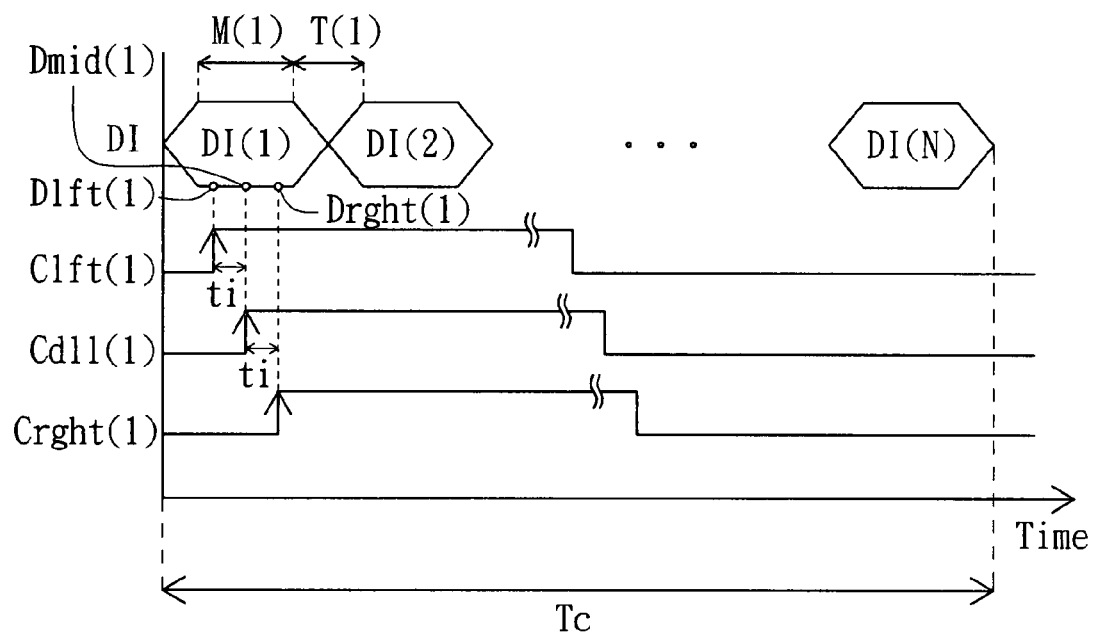
FIG. 3C shows an example of a timing diagram of the N bit data and the first DLL clock signals shown in FIG. 3B, the first left and right clock signals in one period of the initial clock signal.

FIG. 3C shows an example of a timing diagram of the bit data Dl(1) to Dl(N) and the first DLL clock signals Cdll(1) shown in FIG. 3B, the first left and right clock signals Clft(1) and Crght(1) corresponding to the DLL clock signal Cdll(1) in one period Tc of the initial clock signal Cl. Referring to FIG. 3C, the first left clock signal Clft(1) and the first right clock signal Crght(1) are corresponding to the first DLL clock signal Cdll(1). The DLL clock signal Cdll(1) lags behind the left clock signal Clft(1) and leads the right clock signal Crght(1) by a phase difference ti controlled by the control unit 210. The relations of the DLL clock signal Dl(i), the left clock signal Clft(i), and the right clock signal Crght(i) are similar to the relations of the DLL clock signal Dl(1), the left clock signal Clft(1), and the right clock signal Crght(1).

The data latch unit 260 samples the serial N bit data Dl by using the N left clock signals Clft, the N DLL clock signals Cdll and the N right clock signals Crght, to obtain N left data Dlft, N middle data Dmid and N right data Drght, respectively. The N left data Dlft includes left data Dlft(1) to Dlft(N), while the N right data Drght includes right data Drght(1) to Drght(N). Referring to FIG. 3C, take the sampling procedure of the first bit data Dl(1) as an example. In this embodiment, the data latch unit 260 samples the first bit data Dl(1) on the rising edges of the first left clock signal Clft(1), the first DLL clock signal Cdll(1), and the first right clock signal Crght(1), so as to obtain the first left data Dlft(1), the first middle data Dmid(1), and the first right data Drght(1). The sampling procedure of the bit data Dl(2) to Dl(N) are similar to the sampling procedure of the bit data Dl(1). In the embodiment, the data latch unit 260 further outputs the N middle data Dmid as N output data.

The data latch unit 260 feeds the N left data Dlft, the N middle data Dmid and the N right data Drght back to the control unit 210. In the embodiment, after the N left data Dlft, the N middle data Dmid, and the N right data Drght are fed to the control unit 210, the control unit 210 determines whether the $i^{th}$ middle data Dmid(i), the $i^{th}$ left data Dlft(i) and, the $i^{th}$ right data Drght(i) are the same or not, in order to verify whether the $i^{th}$ DLL clock signal Cdll(i) is appropriate to be used to sample the $i^{th}$ bit data Dl(i).

The situation, in which the $i^{th}$ middle data Dmid(i), the $i^{th}$ left data Dlft(i), and the $i^{th}$ right data Drght(i) are the same, implies the skew between the $i^{th}$ DLL clock signal Cdll(i) and the $i^{th}$ bit data Dl(i) is small. Then, the control unit 210 verifies the $i^{th}$ DLL clock signal Cdll(i) is appropriate to be used to sample the $i^{th}$ bit data Dl(i). Therefore, the control unit 210 then controls the sampling clock unit 250 to keep the phases of the $i^{th}$ left clock signals Clft(i) and the $i^{th}$ right clock signals Crght(i) unchanged for sampling next N bit data.

Take the first left data Dlft(1), the first middle data Dmid(1), and the first right data Drght(1) in FIG. 3C as an example. The first bit data Dl(1) is correctly sampled during its middle region M(1) on the rising edges of the first left clock signal Clft(1), the first DLL clock signal Cdll(1), and the first right clock signal Crght(1). The first left, middle, and right data Dlft(1), Dmid(1), and Drght(1) are the same, which implies the skew between the first bit data Dl(1) and the first DLL clock signal Cdll(1) is sufficiently small. Therefore, the first DLL clock signal Cdll(1) is appropriate to be used to sample the first bit data Dl(1) of the next N bit data Dl. Hence, the control unit 210 controls the sampling clock unit 250 to keep the same phase difference ti between the first left clock signal Clft(1) and the first DLL clock signal Cdll(1) and the same phase difference ti between the first DLL clock signal Cdll(1) and the first right clock signal Crght(1). The data sampling procedures of the bit data Dl(2) to Dl(N) are similar to that of the first bit data Dl(1).

When the $i^{th}$ left data, the $i^{th}$ middle data, and the $i^{th}$ right data are not the same, the skew between the $i^{th}$ bit data and the $i^{th}$ DLL clock signal may be too large, which causes the $i^{th}$ bit data to be sampled incorrectly by using the $i^{th}$ DLL clock signal. In this situation, the control unit 210 then controls the sampling clock unit 250 to adjust the $i^{th}$ left clock signal and the $i^{th}$ right clock signal. After the phases of the $i^{th}$ left clock signal and the $i^{th}$ right clock signal are adjusted for several times and the phase difference are smaller than a default threshold, the $i^{th}$ DLL clock signal is determined to be not appropriate to be used to sample the $i^{th}$ bit data of next N bit data correctly. Then, the control unit 210 will select another one of the M PLL clock signal Cpll as the base clock signal Cbase, so as to generate another set of N DLL clock signal Cdll appropriate for sampling the next N bit data.

Figure 4A:
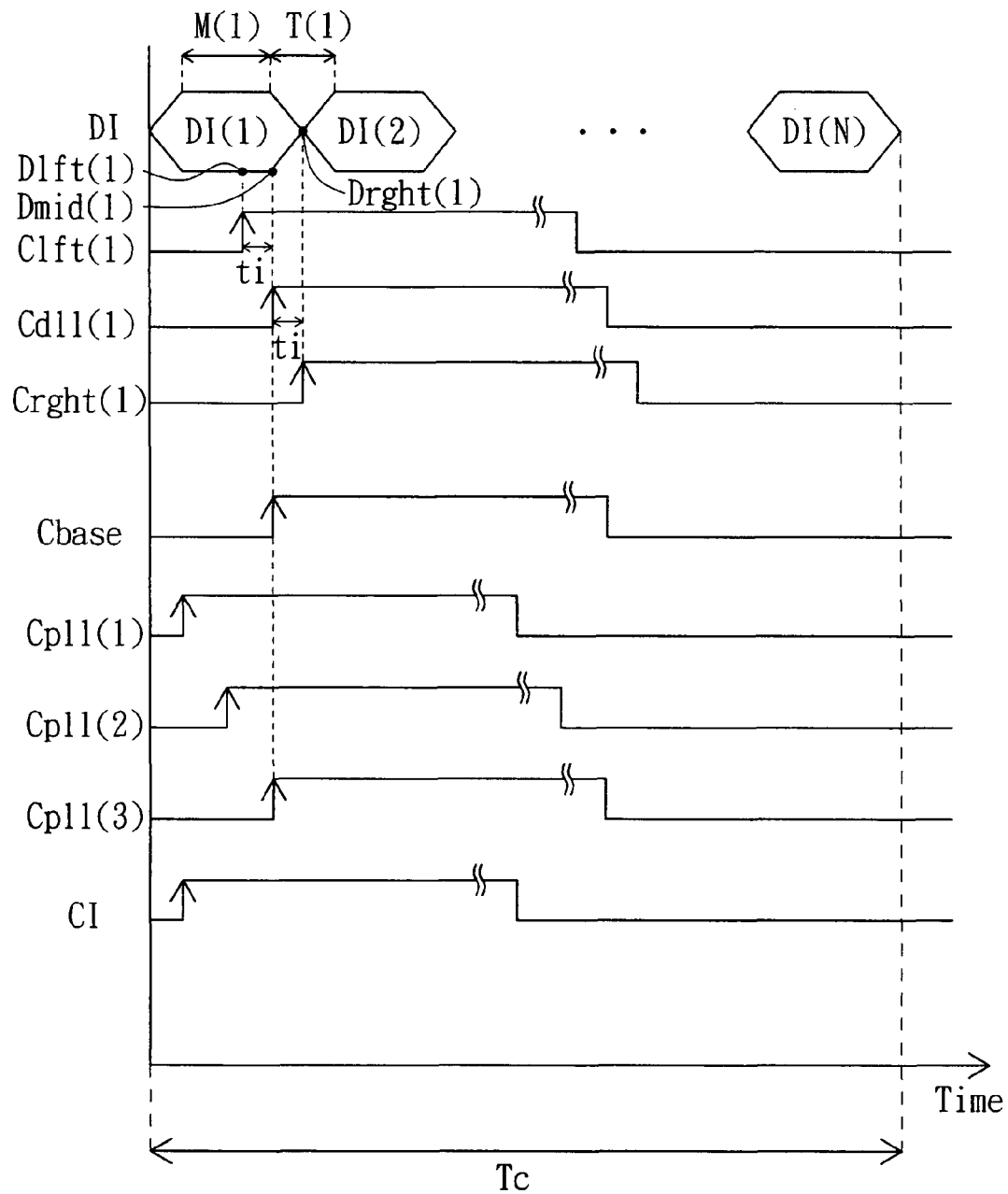
FIG. 4A shows another example of timing diagram of the N bit data the first three PLL clock signals, the base clock signal Cbase, the first DLL clock signal, the first left clock signal, and the first right clock signal in the period of the initial clock signal.

The adjustment of the left and right clock signals and the selection of the new base clock signal are exemplified as follows. FIG. 4A shows another example of timing diagram of the N bit data Dl, the first three PLL clock signals Cpll(1) to Cpll(3), the base clock signal Cbase, the first DLL clock signal Cdll(1), the first left clock signal Clft(1), and the first right clock signal Crght(1) in the period Tc of the initial clock signal Cl.

Referring to FIG. 4A, it is assumed that the third PLL clock signal Cpll(3) is currently selected as the base clock signal Cbase. Take the sampling procedure of the first bit data Dl(1) as an example. The bit data Dl(1) is sampled to obtain the Dlft(1), Dmid(1) and Drght(1), which are fed to the control unit 210.

In this example, although the first bit data Dl(1) is sampled on the rising edge of the first left clock signal Clft(1) during the middle region M(1), the first bit data Dl(1) is also sampled on the rising edge of the first DLL clock signal Cdll(1) and the first right clock signal Crght(1) during the data transition region T(1). Due to being sampled during the data transition region, the first middle data Dmid(1) and the first right data Drght(1) are incorrect. The control unit 210 thus detects that Dmid(1) and Dlft(1) are not the same, which means the obtained middle data Dmid(1) may be incorrect.

In this situation, firstly, the control unit 210 controls the sampling clock unit 250 to adjust the first left clock signals Clft(1) and the first right clock signal Crght(1) by decreasing the phase difference ti between the first left clock signal Clft(1) and the first DLL clock signal Cdll(1) and the phase difference ti between the first DLL clock signal Cdll(1) and the first right clock signal Crght(1) for next N bit data Dl in next period Tc'.

Figure 4B:
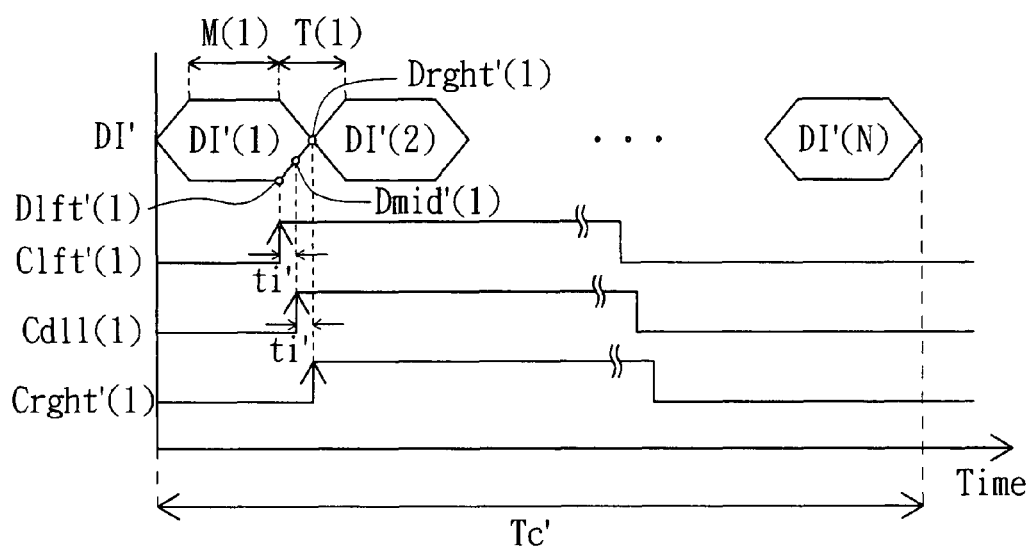
FIG. 4B shows an example of the timing diagram of next N bit data, the first DLL clock signal and the adjusted first left clock signal and the adjusted first right clock signal in the period after the period in FIG. 4A.

FIG. 4B shows an example of the timing diagram of next N bit data Dl', the first DLL clock signal Cdll'(1) and the adjusted first left clock signal Clft'(1) and the adjusted first right clock signal Crght'(1) in the period Tc' after the period Tc in FIG. 4A. As shown in FIG. 4B, the first adjusted left clock signal Clft'(1) and the first adjusted right clock signal Crght'(1) are generated, so that the phase differences ti' is smaller than the phase differences ti in FIG. 4A.

Similarly, the control unit 210 determines whether the left data Dlft'(1), the middle data Dmid'(1) and the right data Drght'(1) generated in FIG. 4B are the same or not. It is shown in FIG. 4B that after adjusting the left clock signal Clft(1) and the right clock signal Crght(1), the left data Dlft(1), the middle data Dmid(1), and the right data Drght(1) are still not the same. Therefore, the phase differences ti' should be further decreased.

If the further decreased phase differences ti' is smaller than the default threshold, the control unit 210 then determines the skew between the DLL clock signal Cdll(1) and the bit data Dl(1) is too large, and the DLL clock signal Cdll(1) is not appropriate to be used to sample next bit data Dl(1). Therefore, the control unit 210 controls the phase select unit 230 to select another PLL clock signal as the base clock signal Cbase for sampling next N bit data.

Figure 4C:
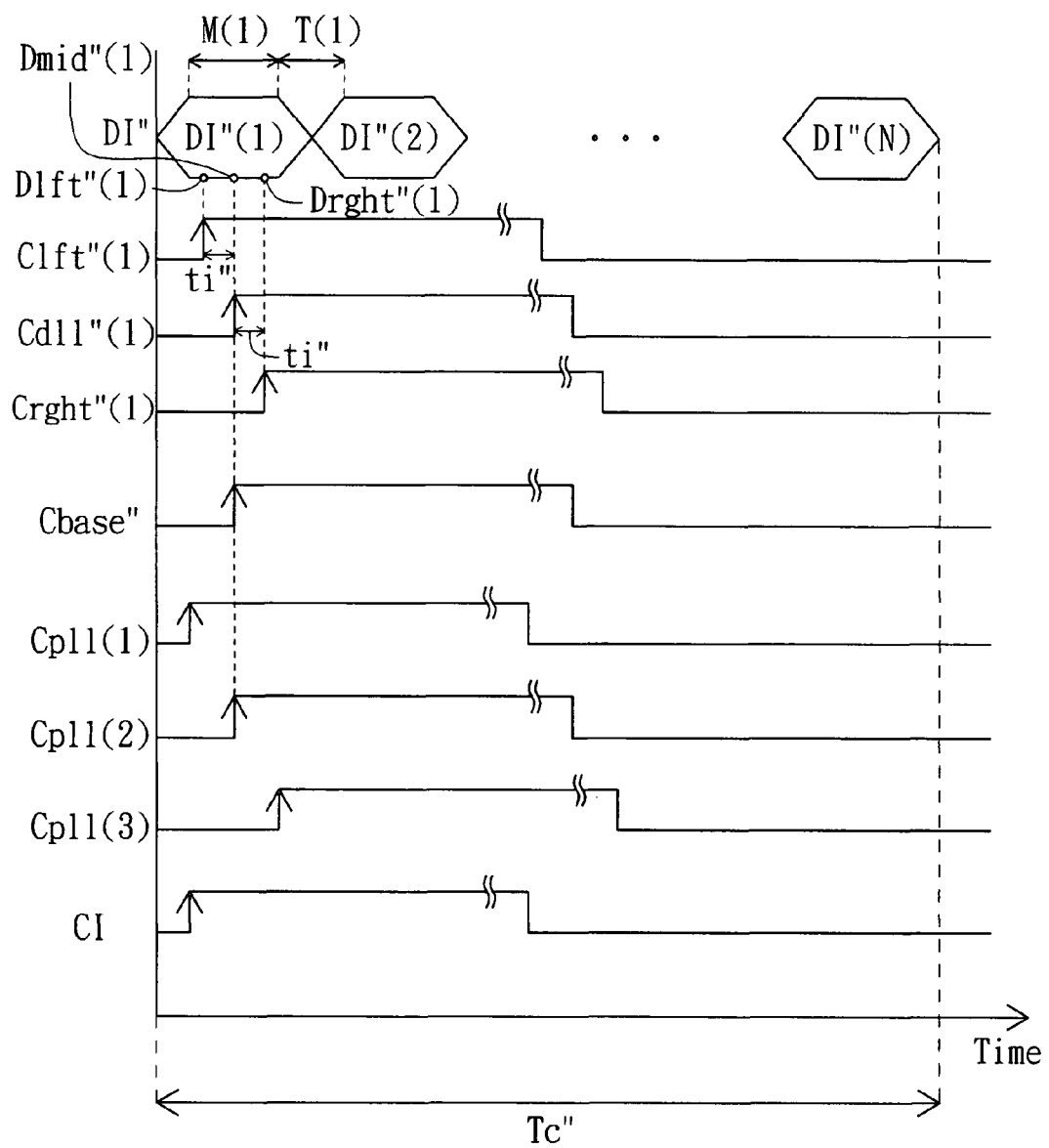
FIG. 4C shows an example of the timing diagram of the next N bit data, the first three PLL clock signal shown in FIG. 4A, the newly selected base clock signal Cbase, the first left clock signal, the first DLL clock signal, and the first right clock signal in the periods after the period in FIG. 4B.

FIG. 4C shows an example of the timing diagram of the next N bit data Dl, the PLL clock signal Cpll(1), Cpll(2), and Cpll(3), the newly selected base clock signal Cbase", the corresponding first left clock signal Clft"(1), the corresponding first DLL clock signal Cdll"(1), and the corresponding first right clock signal Crght"(1) in the period Tc" after the period Tc' in FIG. 4B.

In this example in FIG. 4C, the control unit 210 controls the phase select unit 230 to select the PLL clock signal Cpll(2) as the newly selected base clock signal Cbase". Then, the DLL unit 240 similarly generates corresponding N DLL clock signal Cdll" according to the newly selected base clock signal Cbase". The sampling clock unit 250 similarly generates N corresponding left clock signal Clft" and N corresponding right clock signals Crght" base on the newly generated N DLL clock signals Cdll". In the embodiment, the phase difference ti between the $i^{th}$ left clock signal Clft"(i), the $i^{th}$ DLL clock signal Cdll"(i) and the phase difference ti between the $i^{th}$ DLL clock signal Cdll"(i) and the $i^{th}$ right clock signal Crght"(i) are set to bean default initial value, which is not smaller than the default threshold.

Referring to FIG. 4C, after generating the new base clock signal Cbase", the first bit data Dl"(1) is sampled during its middle region M(1) on the rising edges of the adjusted first left, DLL, and right clock signals Clft"(1), Cdll"(1), and Crght"(1). The sampled first left data Dlft"(1), the sampled first middle data Dmid"(1), and the first right data Drght"(1) are checked whether to be the same or not. If they are the same, then, it is determined that the newly selected base clock signal Cbase" is proper for sampling next set of bit data.

In this example, although the sampling procedure of the bit data Dl(1) is taken as example for description, the sampling procedure of the bit data Dl(2) to Dl(N) is similar to the sampling procedure of the bit data Dl(1). The sampling procedure of the next N bit data repeats the similar sampling procedure.

In this embodiment, the data latch unit 260 is exemplified by sampling the N bit data on the rising edges of the left clock signals, the DLL clock signals, and the right clock signals. In practice, the data latch unit 260 can also be designed as sampling the N bit data on falling edges thereof.

In this embodiment, the sampling clock unit 250 includes a charge pump, a low-pass filter and a number of voltage-control delay lock units. The charge pump generates a voltage according to the control signal Sctrl. The low-pass filter filters the voltage. The voltage-control delay lock units adjust the phases of the N left clock signal Clft and the N right clock signal Crght based on the filtered voltage, so as to adjust the phase differences ti.

Figure 5:
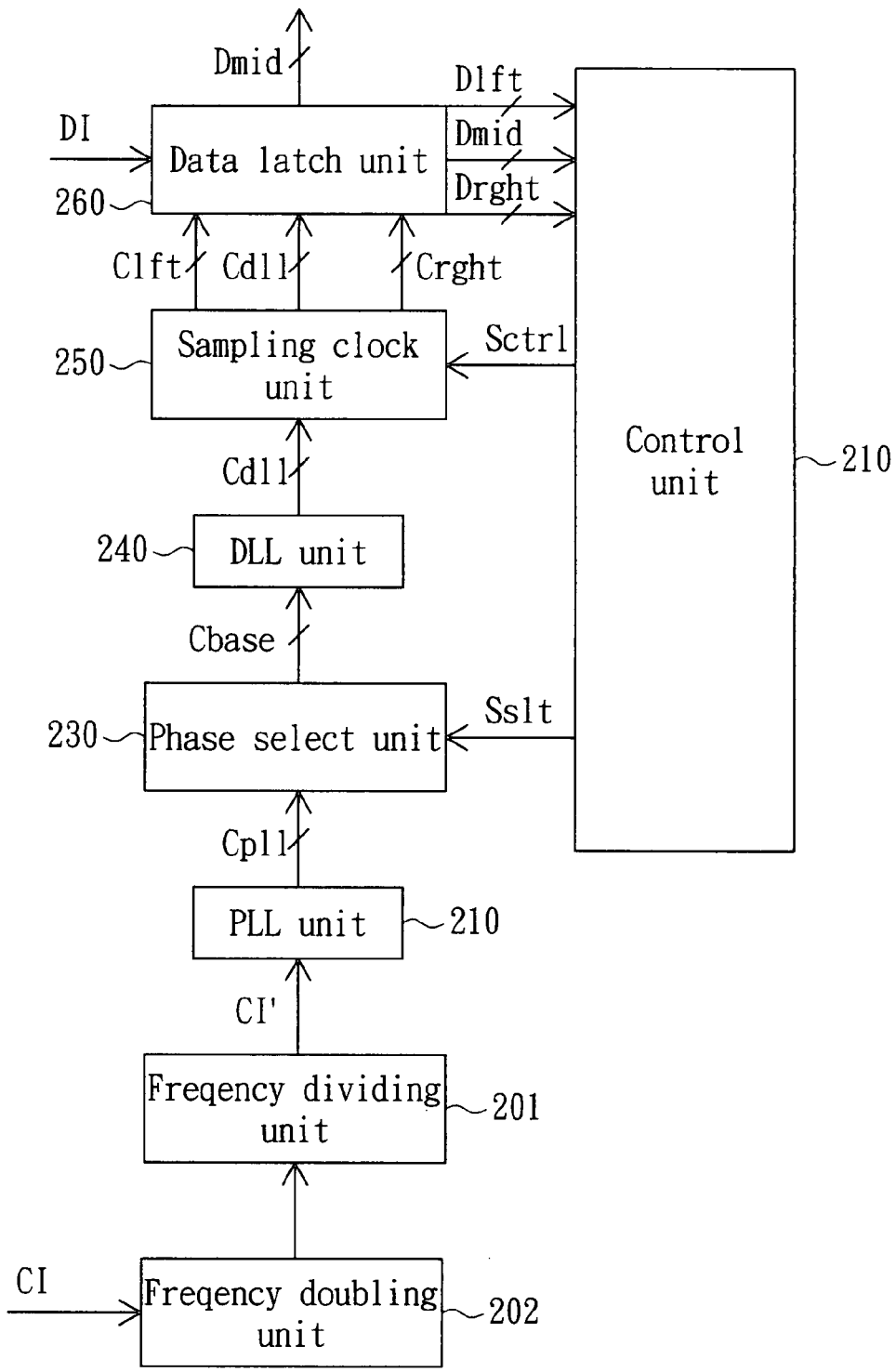
FIG. 5 shows the receiver system according to another embodiment of the invention.

FIG. 5 shows the receiver system according to another embodiment. Referring to FIG. 5, in comparison with the receiver system 200, the receiver system 500 further includes a frequency doubling unit 201 and a frequency dividing unit 202. The frequency doubling unit 201 doubles the frequency of the initial clock signal Cl. The frequency dividing unit 202 then divides the frequency of the initial clock signal Cl by 2 to correct the duty cycle of the initial clock signal Cl before generating the M PLL clock signals Cpll. In this way, the duty cycle of the adjusted initial clock signal Cl' is 50% no matter what duty cycle the initial clock signal Cl has. Furthermore, the high frequency jitter of the N DLL clock signals Cdll generated based on the adjusted initial clock signal Cl' is reduced.

The receiver system according to the embodiments can determine whether the skew between the each DLL clock signals and its corresponding bit data is too large. If the skew is too large to sample the bit data correctly, the phase difference between each DLL clock signal and its corresponding left clock signal and the phase difference between each DLL clock signal and its corresponding right clock signal are decreased. If the adjusted phase difference is not smaller than the default threshold and the sampled bit data is correct by the adjusted left clock signals and right clock signals, the receiver system will determine that the current N DLL clock signals are appropriate for sampling the next N bit data correctly.

If the adjusted phase difference is smaller than the default threshold which means that the left clock signals and the right clock signals might not be further adjusted, the control unit of the receiver system will then select another one of the M PLL clock signal as the base clock signal, so as to generate another set of N DLL clock signals appropriate for sampling next N bit data. The function of selecting of another one of the M PLL clock signal makes the receiver system in the embodiments be capable of automatically tuning the skew between each DLL clock signal and its corresponding bit data, so that the N bit data can be sampled correctly with the N DLL clock signal Cdll. Therefore, even the skew between the initial clock signal Cl and the first bit data Dl(1) is more than half of the bit time, the receiver system still can generate proper N DLL clock signals, which cause the N bit data Dl sampled during their middle region to generate correct data, according to the initial clock signal Cl.

Besides, the high frequency jitter which usually occurs near the data transition area in N bit data would not influence the result of sampling in this embodiment, because the receive system can sample the N bit data during their middle regions. Therefore, the receiver system has high tolerance toward high frequency jitter.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A receiver system, comprising:
 a control unit for outputting a control signal and a selective signal;
 a phase locked loop (PLL) unit for generating M PLL clock signals based on an initial clock signal, wherein the $i^{th}$ PLL clock signal lags behind the $(i+1)^{th}$ PLL clock signals by 1/M of the period of the initial clock signal, i and M are positive integers, i<M;
 a phase select unit for selecting one of the M PLL clock signals as a base clock signal according to the selective signal;
 a delay locked loop (DLL) unit for generating N DLL clock signals based on the base clock signal, wherein the $j^{th}$ DLL clock leads the $(j+1)^{th}$ DLL clock signals by 1/N of the period of the initial clock signal, j and N are positive integers, j<N;
 a sampling clock unit for generating N left clock signals, N right clock signals based on each DLL clock signal, the $k^{th}$ DLL clock signal lags behind the $k^{th}$ left clock signal and leads the $k^{th}$ right clock signal by a phase difference determined by the control signal, k is an positive integer, k<N;

a data latch unit for sampling N bit data in one period of the initial clock according to N left clock signals, N DLL clock signals, and N right clock signals to respectively obtain N left data, N middle data and N right data, wherein the $k^{th}$ left data, the $k^{th}$ middle data and the $k^{th}$ right data are corresponding to the $k^{th}$ left clock signal, the $k^{th}$ DLL clock signal, and the $k^{th}$ right clock signal, and for sampling the $k^{th}$ bit data;

wherein the middle, the left and the right data are fed back to the control unit for outputting the control signal and the selective signal to adjust the phase differences between the left clock signal, the DLL clock signal and the right clock signal, or select the base clock signal for next N bit data.

2. The system according to claim 1, wherein the control unit judges the left, the middle and the right data corresponding to each of the N bit data are substantially the same to output the control signal and the selective signal for the next N bit data.

3. The system according to claim 2, wherein the control unit outputs the control signal to keep the phase difference the same when the left, the middle and the right data corresponding to each of the N bit data are substantially the same.

4. The system according to claim 2, wherein the control unit outputs the control signal to decrease the phase difference when the left, the middle and the right data corresponding to each of the N bit data are not the same.

5. The system according to claim 4, wherein the control unit outputs the selective signal to select another one of the N PLL clock signals as the base clock signal for the next N bit data when the phase difference is smaller than a default threshold value.

6. The system according to claim 1, wherein the PLL unit further doubles the frequency of the initial clock signal and divides it by 2 to correct the duty cycle of the initial clock signal before generating the M PLL clock signals.

7. A receiver system, comprising:
a control unit for outputting a control signal and a selective signal;
a phase locked loop (PLL) unit for generating M PLL clock signals based on an initial clock signal, wherein M is a positive integer;
a phase select unit for selecting one of the M PLL clock signals as a base clock signal according to the selective signal;
a delay locked loop (DLL) unit for generating N DLL clock signals based on the base clock signal, wherein N is a positive integer;
a sampling clock unit for generating N left clock signals, N right clock signals based on each DLL clock signal;
a data latch unit for sampling N bit data according to the N left clock signals, the N DLL clock signals, and the N right clock signals to obtain N left, middle and right data;
wherein the middle, the left and the right data of one of the N bit data are fed back to the control unit for outputting the control signal and the selective signal to adjust phase differences between the left clock signal, the DLL clock signal and the right clock signal, or select the base clock signal for next N bit data;
wherein the control unit outputs the selective signal to select another one of the M PLL clock signals as the base clock signal for the next N bit data when the phase differences are smaller than a default threshold value.

8. The system according to claim 7, wherein the control unit judges whether the left, the middle and the right data of each bit data are the same to output the control signal and the selective signal for the next N bit data.

9. The system according to claim 8, wherein the control unit outputs the control signal to keep the phase differences the same when the left, the middle and the right data corresponding to each of the N bit data are the same.

10. The system according to claim 8, wherein the control unit outputs the control signal to decrease the phase differences when the left, the middle and the right data of a bit data are not the same.

11. The system according to claim 7, wherein the PLL unit further doubles the frequency of the initial clock signal and divides it by 2 to correct the duty cycle of the initial clock signal before generating the M PLL clock signals.

12. An automatic skew-tuning method of a receiver system, comprising:
selecting one of M phase locked loop (PLL) clock signals as a base clock signal according to a selective signal, wherein M is a positive integer;
sampling each of N bit data by one of N delay locked loop (DLL) clock signals, a left clock signal and a right clock signal of the one of N DLL clock signals to obtain a middle data, a left data and a right data, wherein the N DLL clock signals corresponds to the base clock signal, wherein N is a positive integer; and
repeating data sampling procedure against next N bit data by selecting another one of the M PLL clock signals as the base clock signal or adjusting the phase differences between each of the N DLL clock signals and its corresponding left, right clock signals until the left and right data of each of the next N bit data are the same as the middle data of each of the next N bit data, wherein another one of the M PLL clock signals is selected as the base clock signal for the next N bit data if the phase differences are smaller than a default threshold value.

13. The method according to claim 12, further comprising: generating the M PLL clock signals based on an initial clock.

14. The method according to claim 13, wherein before the step of generating the M PLL clock signals, the method further comprises:
doubling the frequency of the initial clock signal and dividing it by 2 to correct the duty cycle of the initial clock signal.

15. The method according to claim 12, further comprising: generating the N DLL clock signals based on the base clock signal.

16. The method according to claim 12, further comprising: generating the left clock signal, the right clock signal with respect to each of the N DLL clock signals.

17. The method according to claim 12, further comprising: outputting the N middle data as N output data.

18. The method according to claim 12, further comprising: determining whether the left, the middle and the right data corresponding to each of the N bit data are substantially the same.

19. The method according to claim 18, wherein when the left, the middle and the right data corresponding to each of the N bit data are not the same, adjusting the phase differences between each left clock signal, its corresponding DLL clock signal and its corresponding right clock signal or selecting another one of the M PLL clock signals as the base clock signal.

20. The method according to claim 19, further comprising decreasing the phase differences when the left, the middle and the right data corresponding to each of the N bit data are not the same.

* * * * *